United States Patent
Kim

(10) Patent No.: US 7,495,974 B2
(45) Date of Patent: Feb. 24, 2009

(54) DELAY SELECTING CIRCUIT FOR SEMICONDUCTOR MEMORY DEVICE

(75) Inventor: Kyung-Whan Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 103 days.

(21) Appl. No.: 11/647,669

(22) Filed: Dec. 29, 2006

(65) Prior Publication Data

US 2008/0080271 A1    Apr. 3, 2008

(30) Foreign Application Priority Data

Sep. 29, 2006   (KR) ................. 10-2006-0096303

(51) Int. Cl.
*G11C 8/18* (2006.01)

(52) U.S. Cl. ............ 365/194; 365/189.07; 365/189.09; 365/230.02; 365/233.12; 365/233.19; 365/228

(58) Field of Classification Search ............... 365/228, 365/194, 191, 189.07, 189.09, 230.02, 233.12, 365/233.19, 233.5
See application file for complete search history.

(56) References Cited

U.S. PATENT DOCUMENTS

| | | | |
|---|---|---|---|
| 6,188,616 B1* | 2/2001 | Na | 365/194 |
| 6,335,885 B1* | 1/2002 | Shimizu | 365/194 |
| 6,456,543 B1* | 9/2002 | Lee | 365/190 |
| 7,148,732 B2* | 12/2006 | Kakuda et al. | 327/262 |
| 7,177,207 B1* | 2/2007 | Vernenker et al. | 365/194 |
| 2006/0221749 A1* | 10/2006 | Kwean | 365/226 |
| 2007/0070766 A1* | 3/2007 | Kim | 365/222 |

FOREIGN PATENT DOCUMENTS

| | | |
|---|---|---|
| KR | 0122108 | 9/1997 |
| KR | 1999-0065148 | 8/1999 |
| KR | 2001-0001153 | 1/2001 |
| KR | 10-2004-0092722 | 11/2004 |

* cited by examiner

*Primary Examiner*—Andrew Q Tran
(74) *Attorney, Agent, or Firm*—Blakely, Sokoloff, Taylor & Zafman LLP

(57) ABSTRACT

A delay selection circuit for use in a semiconductor memory device prevents a tAA from increasing at a read operation due to a delayed command type of signal. The delay selection circuit includes a delay line unit, a power supply voltage detection unit and a path selection unit. The delay line unit has two delay lines for delaying a command type of signal by different delay amounts. The power supply voltage detection unit detects a voltage level of a power supply voltage. The path selection unit selects one of each output of the two delay lines according to an output of the power supply voltage detection unit.

12 Claims, 8 Drawing Sheets

DELAY SELECTING CIRCUIT FOR SEMICONDUCTOR MEMORY DEVICE

CROSS-REFERENCE(S) TO RELATED APPLICATIONS

The present invention claims priority of Korean patent application no. 10-2006-0096303, filed in the Korean Patent Office on Sep. 29, 2006, which is incorporated by reference in its entirety.

BACKGROUND OF THE INVENTION

The present invention relates to a semiconductor memory device; and, more particularly, to a semiconductor memory device for preventing discordance of a signal timing, which occurs as a chip size and the number of banks are increased in the semiconductor memory device, between data type of signals and command type of signals.

FIG. 1 illustrates a block diagram showing a semiconductor memory device having eight banks. As capacity of a semiconductor memory device is increased and a semiconductor memory device having high-performance, e.g., a double data rate 3 (DDR3) ram, is developed, a bank structure of the semiconductor memory device has been changed from a conventional 4-bank structure to an 8-bank structure shown in FIG. 1.

Generally, a data input/output pad is called a DQ pad and an address and command pad is called an AC pad. At a writing operation, a data is transferred from the DQ pad to a bank and a writing command is transferred from the AC pad to the bank.

As shown in FIG. 1, the DQ pads and the AC pads are placed together in one part of a chip. Therefore, according to a position of each bank, the bank is far from the DQ pad or near the DQ pad. Likewise, the bank is far from the AC pad or near the AC pad.

In case of a sixth and an eighth banks BANK5 and BANK7 marked as DQ worst and CMD (command) best, the banks are far from the DQ pad and near the AC pad. On the other hand, in case of a first and a third banks BANK0 and BANK2 marked as DQ best and CMD worst, the banks are near the DQ pad and far from the AC pad.

FIG. 2 illustrates a signal timing diagram depicting a writing operation at the bank. The upper diagram shows the fastest PVT (process, voltage and temperature) conditions at the position of DQ best and CMD worst. Herein, under the fastest PVT condition, the process tends to fast factors of characteristics and the voltage is high and the temperature is low so that a circuit can have the characteristics of highest operational speed. On the contrary, the lower diagram shows the slowest PVT conditions.

A data to be written in a bank is transferred from the DQ pad to the bank. The transferred data is written in the bank by a bank writing enabling signal BWEN. A column selection signal YS is selected by a column address. The data is written in a memory cell coupled to a column selected while the column selection signal YS is a high level. Herein, the column selection signal YS should become a high level almost at the same time when the bank writing enabling signal BWEN becomes a high level. Therefore, when the bank writing enabling signal BWEN is advanced or delayed, the column selection signal YS should be moved together with the writing enabling signal BWEN.

Meanwhile, for explaining the Data(GIO), generally, the number of logic gates through which a data is transferred to a bank is minimized so that the data has a minimum delay time. However, the data is passed through a long wire line to be transferred to the bank. The long wire line is called a global input/output (GIO) line. The GIO line has the characteristics of RC delay and variation of its characteristics at the fastest PVT conditions and the slowest PVT conditions is small. The data passed through the GIO line, i.e., Data(GIO), is classified into a data type of signal. The tGIO indicates a timing difference of the data type of signal due to the PVT variation.

On the contrary, the bank writing enabling signal BWEN and the column selection signal YS are passed through relatively large numbers of logic gates including a timing circuit and complicated control circuits. Thus, the bank writing enabling signal BWEN and the column selection signal YS are sensitively varied according to the PVT variation. Such signals are classified into a command type of signal. The tCMD indicates a timing difference of the command type of signal due to the PVT variation. As shown, the tCMD is larger than the tGIO.

For the data to be written in the bank, the data should arrive earlier than the command and an appropriate timing margin (tMARGIN) should be secured. Generally, under the fastest PVT conditions, the command type of signal which is sensitive to the PVT variation is faster than the data type of signal. Therefore, in this case, the command type of signal is delayed for the purpose of securing appropriate timing margin. Particularly, under the fastest PVT conditions at the position of DQ worst and CMD best as shown in the upper diagram, the command type of signal is transferred at highest speed. In this case, it is needed to delay the command type of signal.

Meanwhile, under the slowest PVT conditions and the position of DQ best and CMD worst as shown in the lower diagram, the speed of the command type of signal is lowest. Since the data type of signal is not much influenced by the PVT variation and the position is DQ best, the data type of signal arrives at the bank relatively early in spite of the slowest PVT condition.

On the contrary, the command type of signal arrives very late. That is, with the position of CMD worst, the delay amount applied to the command type of signal for securing the appropriate time margin is increased under the slowest PVT conditions.

The column selection signal YS becomes a high level as a pulse not only at the writing operation but at a reading operation. According to the reading operation, a data of a bank is transferred to the GIO line. Herein, since the column selection signal YS is delayed as above-mentioned, a tAA is increased. Herein, the tAA is a performance index for showing how fast a data can be outputted from a reading command. The tAA is an important value for determining a performance of a semiconductor memory device.

SUMMARY OF THE INVENTION

Embodiments of the present invention are directed to provide a delay selection circuit for preventing a tAA from increasing at a read operation due to a delayed command type of signal.

In accordance with an aspect of the present invention, there is provided a delay selection circuit for use in a semiconductor memory device, including: a delay line unit having two delay lines for delaying a command type of signal by different delay amounts; a power supply voltage detection unit for detecting a voltage level of a power supply voltage; and a path selection unit for selecting one of each output of the two delay lines according to an output of the power supply voltage detection unit.

In accordance with another aspect of the present invention, there is provided a delay selection circuit for use in a semiconductor memory device, including: a delay line unit having two delay lines for delaying a command type of signal by different delay amounts; a power supply voltage detection unit for detecting a voltage level of a power supply voltage; a storing unit for outputting a constant value by storing an output of the power supply voltage detection unit at an input timing of the command type of signal till a subsequent input timing; a path selection unit for selecting one of each output of the two delay lines according to an output of the storing unit.

DESCRIPTION OF SPECIFIC EMBODIMENTS

Under high level of a power supply voltage, a command type of signal is delayed at a writing operation in order to secure a timing margin. However, a tAA is decreased at a reading operation due to a delayed command type of signal. In accordance with the present invention, it is possible to select a delay amount according to a voltage level of the power supply voltage. Therefore, the above-mentioned problem can be prevented. Further, by adding a storing unit, the problem of a command type of signal having two pulses when the power supply voltage is changed during a short time interval can be solved.

Hereinafter, a delay selection circuit in accordance with the present invention will be described in detail referring to the accompanying drawings.

Figure 1:
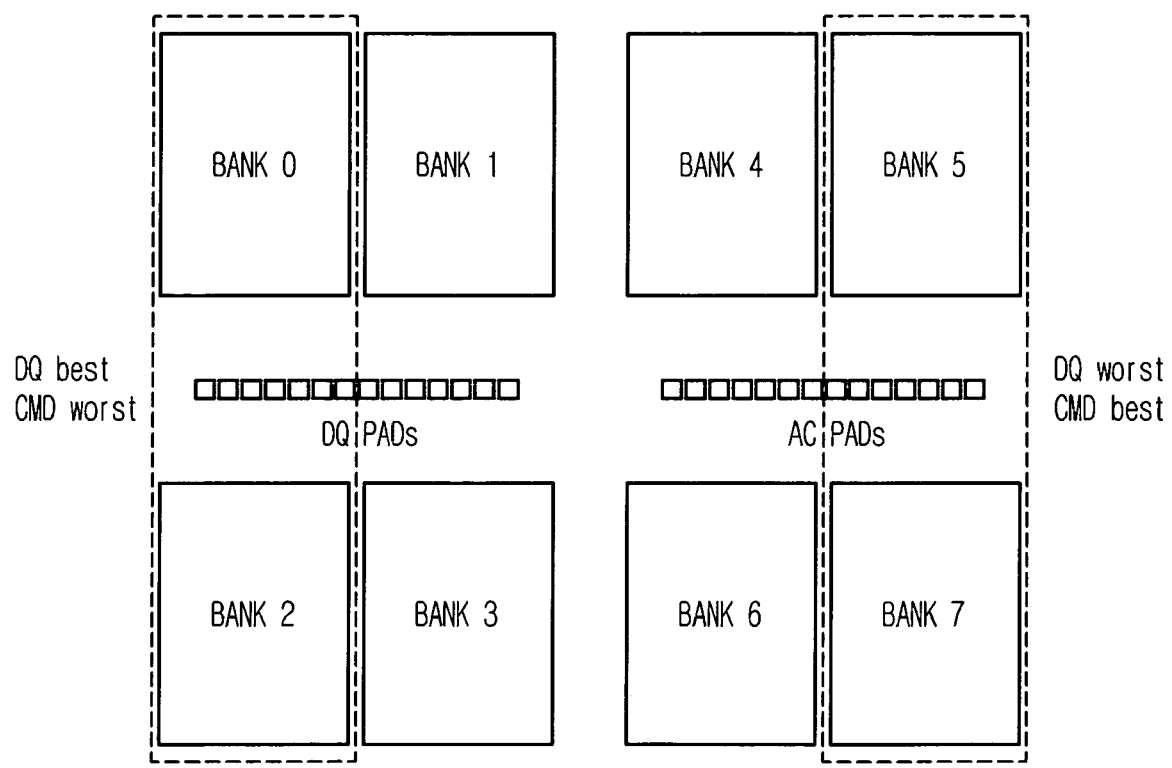
FIG. 1 illustrates a block diagram showing a semiconductor memory device having eight banks.
Figure 2:
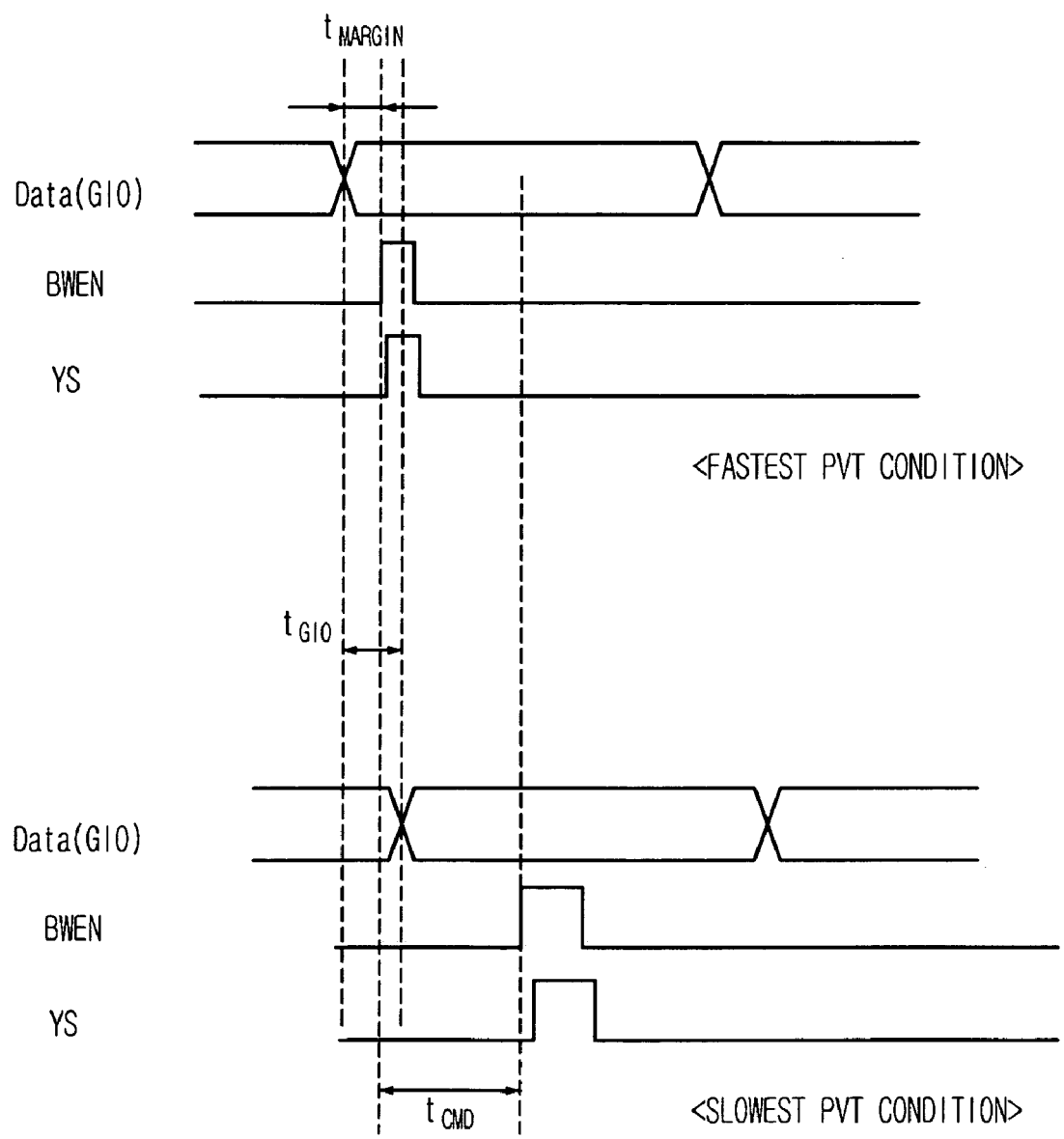
FIG. 2 illustrates a signal timing diagram depicting a writing operation at the bank.
Figure 3:
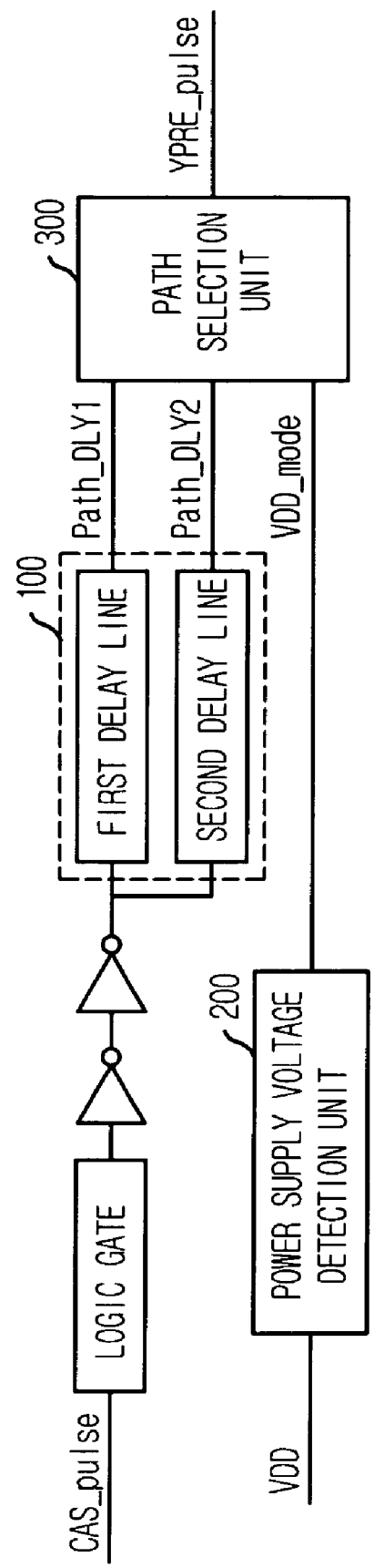
FIG. 3 illustrates a block diagram showing a delay selection circuit for use in a semiconductor memory device in accordance with the present invention.

FIG. 3 illustrates a block diagram showing a delay selection circuit for use in a semiconductor memory device in accordance with the present invention. The delay selection circuit includes a delay line unit 100, a power supply voltage detection unit 200 and a path selection unit 300.

The delay line unit 100 includes two delay lines for delaying a command type of signal CAS_pulse by different delay amounts in order to generate a first delayed signal Path_DLY1 and a second delayed signal Path_DLY2. The power supply voltage detection unit 200 detects a voltage level of a power supply voltage VDD and outputs a detection result signal VDD_mode to the path selection unit 300. The path selection unit 300 selects one of the first and the second delayed signals Path_DLY1 and Path_DLY2 according to the detection result signal VDD_mode in order to output the selected signal as an output signal YPRE_pulse.

That is, after detecting a voltage level of the power supply voltage VDD which is the most important factor for determining the PVT condition, the second delayed signal Path_DLY2 is selected when the voltage level of the power supply voltage VDD is high or the first delayed signal Path_DLY1 is selected when the voltage level of the power supply voltage VDD is low. Herein, the second delayed signal Path_DLY2 is generated by one of the two delay lines which has a larger delay amount and the first delayed signal Path_DLY1 is generated by the other of the two delay lines which has a smaller delay amount.

As above-mentioned, the command type of signal CAS_pulse is purposely delayed not to arrive at a bank too early at the fast PVT conditions. Accordingly, the command type of signal is too much delayed at the slow PVT conditions, which causes the problem of increasing tAA. However, in accordance with the delay selection circuit, the delay amount is adjusted according to the PVT conditions for solving the above-mentioned problem. That is, at the fast PVT condition, i.e., when the power supply voltage VDD is high, the delay amount is increased; at the slow PVT condition, i.e., when the power supply voltage VDD is low, the delay amount is decreased or becomes 0.

Figure 4:
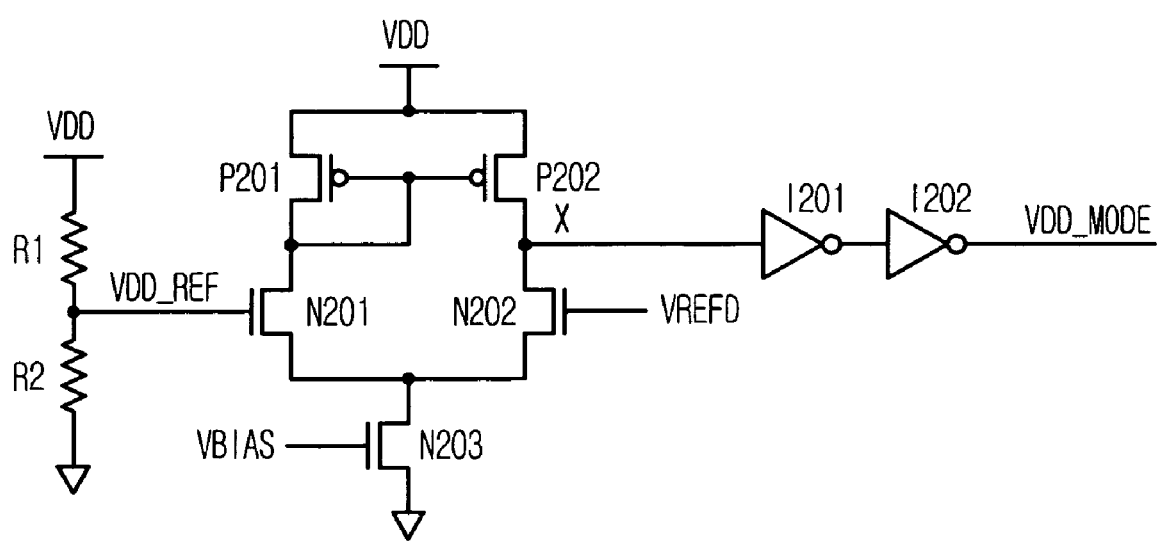
FIG. 4 illustrates a schematic circuit diagram depicting the power supply voltage detection unit shown in FIG. 3.

FIG. 4 illustrates a schematic circuit diagram depicting the power supply voltage detection unit 200 shown in FIG. 3. The power supply voltage detection unit 200 compares a divided voltage VDD_REF with a reference voltage VREFD to output a high level of signal when the divided voltage VDD_REF is higher than the reference signal VREFD. Herein, the divided voltage VDD_REF is generated by dividing the power supply voltage VDD.

The power supply voltage detection unit 200 includes resistors, PMOS and NMOS transistors and inverters. The two resistors R1 and R2 divide the power supply voltage VDD. The first NMOS transistor N201 whose drain and source are respectively coupled to a first terminal and a second terminal receives the divided voltage VDD_REF through its gate. The first PMOS transistor P201 whose drain and source are respectively coupled to the first terminal and the power supply voltage VDD receives a voltage loaded on the first terminal through its gate. The second PMOS transistor P202 whose drain and source are respectively coupled to a third terminal and the power supply voltage VDD receives the voltage loaded on the first terminal through its gate. The second NMOS transistor N202 whose drain and source are respectively coupled to the third terminal and the second terminal receives the reference voltage VREFD through its gate. The third NMOS transistor N203 whose drain and source are respectively coupled to the second terminal and a ground voltage receives a bias voltage VBIAS through its gate. The two inverters I201 and I202 connected in series invert a voltage loaded on the third terminal twice to output the detection result signal VDD_mode.

Herein, for the divided voltage VDD_REF to have the identical voltage level as the reference voltage VREFD when the power supply voltage VDD reaches a target level, a resistance is divided. The reference voltage VREFD has a constant voltage level regardless of the power supply voltage VDD and can be easily generated by a general reference voltage generator. The bias voltage VBIAS biases the third NMOS transistor N203 for the power supply voltage detection unit 200 to operate.

Meanwhile, when the power supply voltage VDD becomes higher than the target level, the divided voltage VDD_REF is accordingly higher than the reference voltage VREFD. Thus, a voltage level at a node X is increased to nearly the power supply voltage VDD so that the detection result signal VDD_mode becomes a high level.

On the assumption that the reference voltage VREFD has a constant voltage level of 0.8V, for the power supply voltage detection unit 200 to be designed so that the detection result signal VDD_mode is outputted as a high level when the power supply voltage VDD becomes 1.6V or higher, the resistance is divided for the divided voltage VDD_REF to have a voltage level of 0.8V when the power supply voltage VDD is 1.6V (resistances of the resistors R1 and R2 is identical). Further, the resistors R1 and R2 can be replaced by diode-connected transistors connected in series for dividing the power supply voltage VDD.

Figure 5:
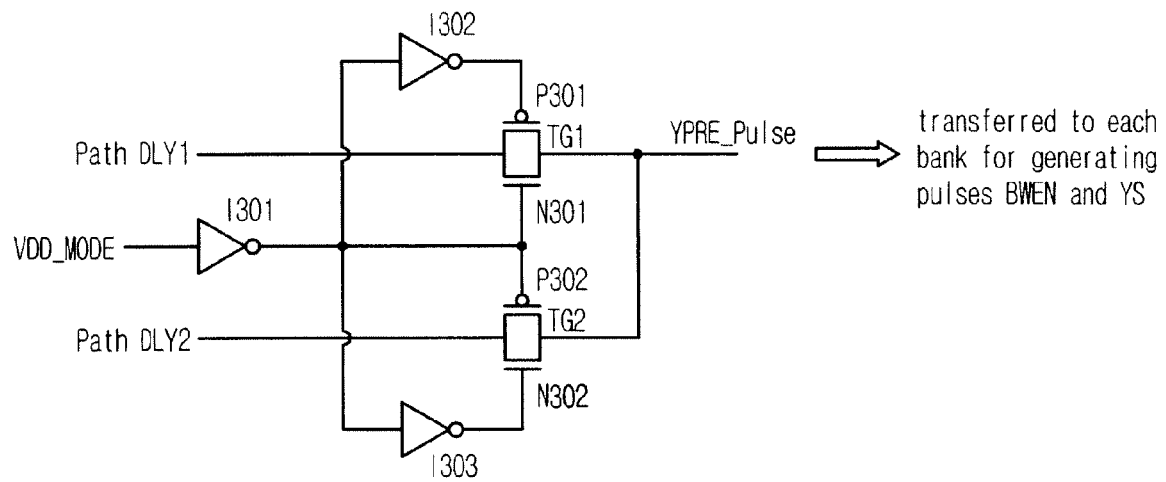
FIG. 5 illustrates a schematic circuit diagram depicting the path selection unit shown in FIG. 3.

FIG. 5 illustrates a schematic circuit diagram depicting the path selection unit 300 shown in FIG. 3. The path selection unit 300 includes two transfer gates TG1 and TG2 for selecting the second delayed signal Path_DLY2 when the power supply voltage VDD is high and for selecting the first delayed signal Path_DLY1 when the power supply voltage VDD is low. The second delayed signal Path_DLY2 is more delayed than the first delayed signal Path_DLY1.

In detail, the path selection unit 300 includes inverters and PMOS and NMOS transistors. The first inverter I301 inverts the output signal of the power supply voltage detection unit 200. The first NMOS transistor N301 whose gate receives an output of the first inverter I301 transfers the first delayed signal Path_DLY1 to an output terminal (YPRE_pulse) of the path selection unit 300 through a drain-source path of the first NMOS transistor N301. The second inverter I302 inverts the output of the first inverter I301. The first PMOS transistor P301 whose gate receives an output of the second inverter I302 transfers the first delayed signal Path_DLY1 to the output terminal of the path selection unit 300 through a drain-source path of the first PMOS transistor P301. The second PMOS transistor P302 whose gate receives the output of the first inverter I301 transfers the second delayed signal Path_DLY2 to the output terminal of the path selection unit 300 through a drain-source path of the second PMOS transistor P302. The third inverter I303 inverts the output of the first inverter I301. The second NMOS transistor N302 whose gate receives an output of the third inverter I303 transfers the second delayed signal Path_DLY2 to the output terminal of the path selection unit 300 through a drain-source path of the second NMOS transistor N302.

When the detection result signal VDD_mode is a high level, the second NMOS transistor N302 and the second PMOS transistor P302 which constitute the second transfer gate TG2 are turned on so that the second delayed signal Path_DLY2 is selected. Likewise, when the detection result signal VDD_mode is a low level, the first NMOS transistor N301 and the first PMOS transistor P301 which constitute the first transfer gate TG1 are turned on so that the first delayed signal Path_DLY2 is selected.

Although the path selection unit 300 includes two transfer gates to select one of the outputs of the delay unit 100, the transfer gates can be replaced with other logic gates, e.g., an inverter, a NAND gate or a NOR gate, for the same operation.

Figure 6:
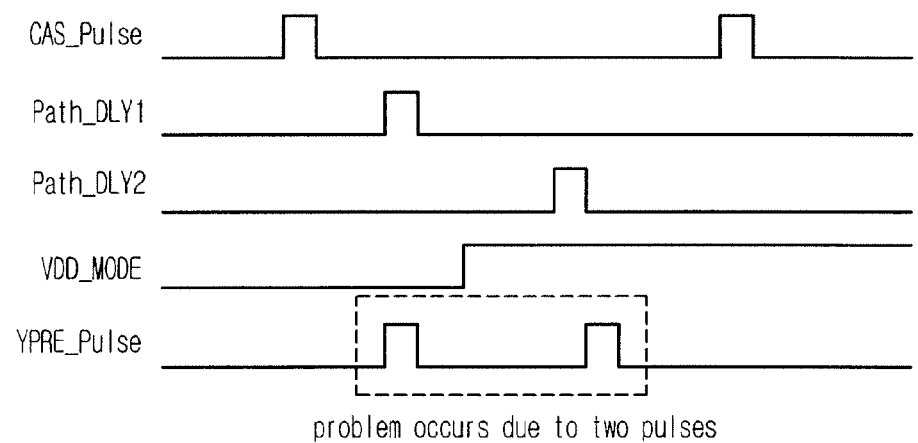
FIG. 6 illustrates a timing diagram showing a problem when the power supply voltage is changed during a short time.

FIG. 6 illustrates a timing diagram showing a problem when the power supply voltage VDD is changed during a short time. The detection result signal VDD_mode becomes a high level or a low level according to a variation of the power supply voltage VDD. Therefore, it may be assumed that the detection result signal VDD_mode is changed from a low level to a high level. Since the second delayed signal Path_DLY2 is a more delayed signal than the first delayed signal Path_DLY1, when the detection result signal VDD_mode is changed from a low level to a high level between each pulse of the first and the second delayed signals Path_DLY1 and Path_DLY2, the output signal YPRE_pulse of the path selection unit 300 has two pulses causing an error of a column access operation as shown in FIG. 6.

Figure 7:
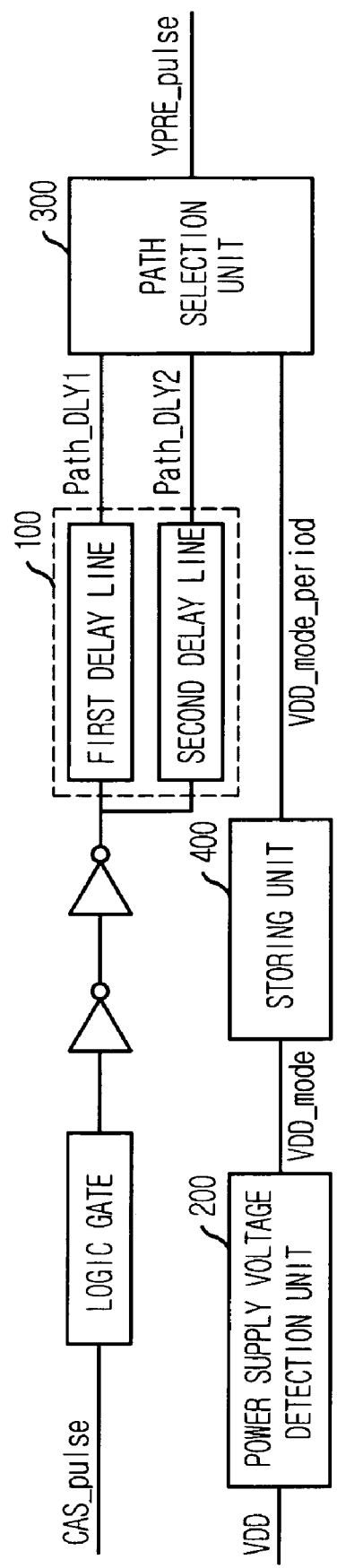
FIG. 7 illustrates a block diagram depicting a delay selection circuit in accordance with a second embodiment of the present invention.

FIG. 7 illustrates a block diagram depicting a delay selection circuit in accordance with a second embodiment of the present invention. In comparison with a delay selection circuit according to the first embodiment, the delay selection circuit further includes a storing unit 400.

The storing unit 400 stores the detection result signal VDD_mode at a command input timing (high pulse period) of the command type of signal CAS_pulse and outputs a constant value to the path selection unit 300 till a subsequent command input timing. Therefore, the above-mentioned problem shown in FIG. 6 can be prevented. The storing unit 400 is a type of a D flip-flop which receives the detection result signal VDD_mode through a D terminal and the command type of signal CAS_pulse through a clock terminal.

Figure 8:
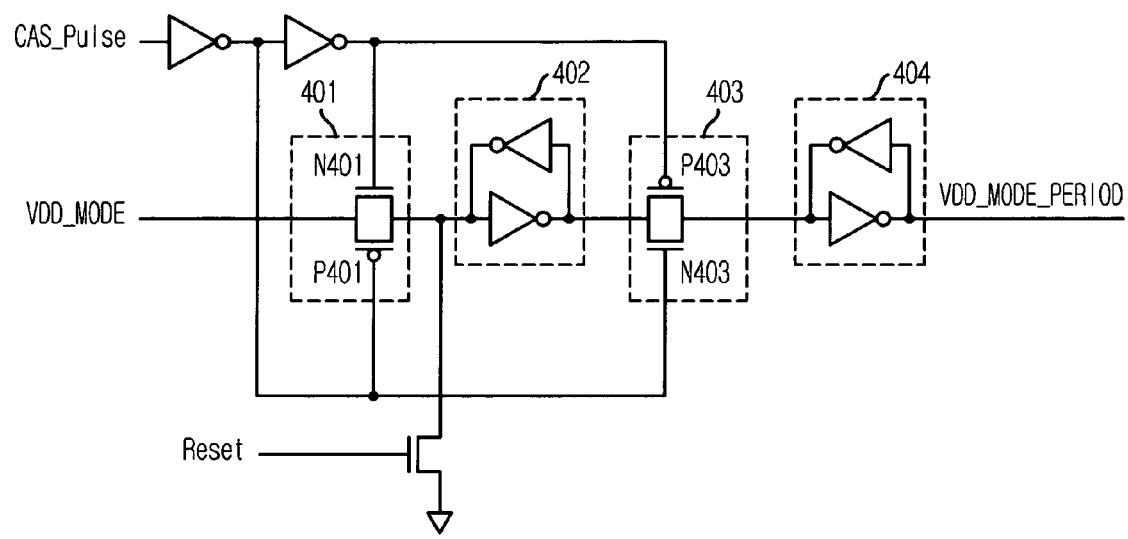
FIG. 8 illustrates a schematic circuit diagram illustrating the storing unit shown in FIG. 7.

FIG. 8 illustrates a schematic circuit diagram illustrating the storing unit 400 shown in FIG. 7. The storing unit 400 includes a first transfer gate 401 for transferring the output signal of the power supply voltage detection unit 200 when the command type of signal CAS_pulse is a high level; a first latch unit 402 for latching an output of the first transfer gate 402; a second transfer gate 403 for transferring an output of the first latch unit 402 when the command related signal CAS_pulse is a low level; and a second latch unit 404 for latching and outputting an output of the second transfer gate 403.

In detail, the first transfer gate 401 includes NMOS and PMOS transistors. The first NMOS transistor N401 whose gate receives the command type of signal CAS_pulse transfers the detection result signal VDD_mode through a drain-source path of the first NMOS transistor N401. The first PMOS transistor P401 whose gate receives an inverted version of the command type of signal CAS_pulse transfers the detection result signal VDD_mode through a drain-source path of the first PMOS transistor P401. The first latch unit 402 includes two inverters whose input and output are cross-coupled.

The second transfer gate 403 includes PMOS and NMOS transistors. The second P403 whose gate receives the command type of signal CAS_pulse transfers the output of the first latch unit 402 through a drain-source path of the second PMOS transistor P403. The second NMOS transistor N403 whose gate receives the inverted version of the command type of signal CAS_pulse transfers the output of the first latch unit 402 through a drain-source path of the second NMOS transistor N403. The second latch unit 404 includes two inverters whose input and output are cross-coupled.

When the command type of signal CAS_pulse is a high level, the first transfer gate 401 is turned on so that the detection result signal VDD_mode is stored in the first latch unit 402. When the command type of signal CAS_pulse is a low level, the second transfer gate 403 is turned on so that the signal stored in the first latch unit 402 is transferred to the second latch unit 404 and is latched to be outputted as an output signal VDD_mode_period of the storing unit 400 at the same time.

In brief, when the column access command begins, the output signal of the power supply voltage detection unit 200 is stored to be kept until a subsequent column access command is inputted.

Figure 9:
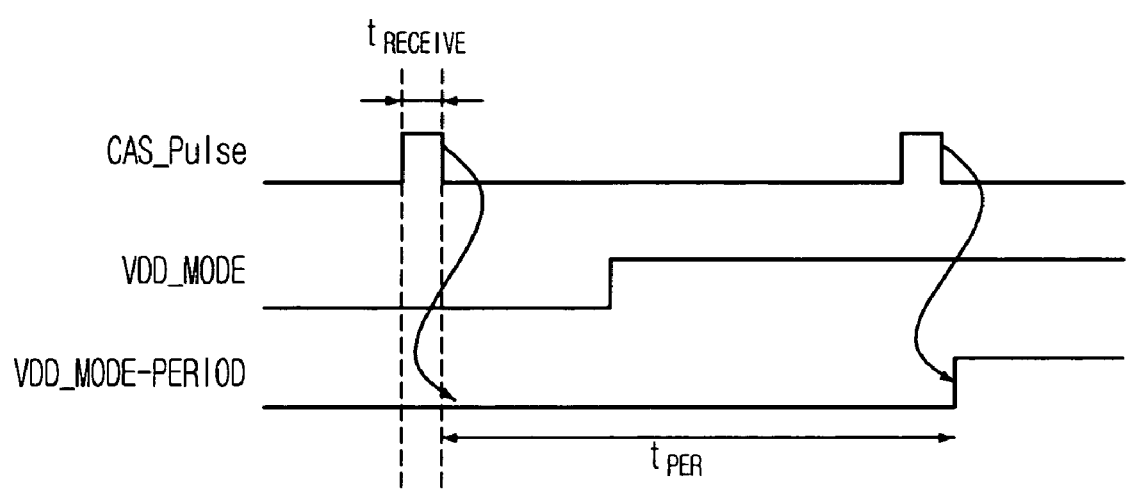
FIG. 9 illustrates a timing diagram depicting an operation of the storing unit shown in FIG. 8.

FIG. 9 illustrates a timing diagram depicting an operation of the storing unit 400 shown in FIG. 8.

During a high pulse period (tRECEIVE) of the command type of signal CAS_pulse, the storing unit 400 receives the detection result signal VDD_mode and, then, generates the output signal VDD_mode_period by lathing the received signal at a falling edge. The storing unit 400 constantly keeps the output signal VDD_mode_period from a high pulse of the command type of signal CAS_pulse to a subsequent high pulse of the command type of signal CAS_pulse (tPER). Therefore, the above-mentioned problem shown in FIG. 6 does not occur.

While the present invention has been described with respect to the specific embodiments, it will be apparent to those skilled in the art that various changes and modifications may be made without departing from the spirit and scope of the invention as defined in the following claims.

What is claimed is:

1. A delay selection circuit for use in a semiconductor memory device, comprising:
    a delay line unit having two delay lines for delaying a command type of signal by different delay amounts;
    a power supply voltage detection unit for detecting a voltage level of a power supply voltage;
    a storing unit for outputting a constant value by storing an output of the power supply voltage detection unit at a command input timing of the command type of signal till a subsequent command input timing; and
    a path selection unit for selecting one of each output of the two delay lines according to an output of the storing unit.

2. The delay selection circuit as recited in claim 1, wherein the storing unit is a D flip-flop for receiving the output of the power supply voltage detection unit through a D terminal and for receiving the command type of signal through a clock terminal in order to output a result signal.

3. The delay selection circuit as recited in claim 1, wherein the storing unit stores the output of the power supply voltage detection unit when the command type of signal is a high level and outputs the stored signal when the command type of signal is a low level.

4. The delay selection circuit as recited in claim 1, wherein the storing unit includes:
    a first transfer gate for transferring the output of the power supply voltage detection unit when the command type of signal is a high level;
    a first latch unit for latching and outputting an output of the first transfer gate;
    a second transfer gate for transferring an output of the first latch unit when the command type of signal is a low level; and
    a second latch unit for latching and outputting an output of the second transfer gate.

5. The delay selection circuit as recited in claim 4, wherein the first transfer gate includes:
    a first NMOS transistor whose gate receives the command type of signal for transferring the output of the power supply voltage detection unit through a drain-source path of the first NMOS transistor; and
    a first PMOS transistor whose gate receives an inverted version of the command type of signal for transferring the output of the power supply voltage detection unit through a drain-source path of the first PMOS transistor.

6. The delay selection circuit as recited in claim 4, wherein the first latch unit includes two inverters whose inputs and outputs are cross-coupled.

7. The delay selection circuit as recited in claim 4, wherein the second transfer gate includes:
    a second PMOS transistor whose gate receives the command type of signal for transferring the output of the first latch unit through a drain-source path of the second PMOS transistor; and
    a second NMOS transistor whose gate receives an inverted version of the command type of signal for transferring the output of the first latch unit through a drain-source path of the second NMOS transistor.

8. The delay selection circuit as recited in claim 4, wherein the second latch unit includes two inverters whose inputs and outputs are cross-coupled.

9. The delay selection circuit as recited in claim 1, wherein one of the two delay lines has a delay amount of 0.

10. The delay selection circuit as recited in claim 1, wherein the power supply voltage detection unit compares a divided voltage with a reference voltage to generate a high level signal when the divided voltage is higher than the reference voltage, wherein the divided voltage is generated by dividing the power supply voltage.

11. The delay selection circuit as recited in claim 1, wherein the path selection unit selects an output of one of the two delay lines which has a larger delay amount when the power supply voltage is high and selects an output of the other delay line which has a smaller delay amount when the power supply voltage is low.

12. The delay selection circuit as recited in claim 1, wherein the path selection unit includes two transfer gates for transferring outputs of the two delay lines and turns on one of the two transfer gates according to the power supply voltage.

* * * * *